(12) United States Patent
Nishi

(10) Patent No.: US 8,415,249 B2
(45) Date of Patent: Apr. 9, 2013

(54) METHOD OF MANUFACTURING SEMICONDUCTOR DEVICE

(75) Inventor: Masahiro Nishi, Kanagawa (JP)

(73) Assignee: Sumitomo Electric Device Innovations, Inc., Yokohama-shi, Kanagawa (JP)

(*) Notice: Subject to any disclaimer, the term of this patent is extended or adjusted under 35 U.S.C. 154(b) by 84 days.

(21) Appl. No.: 13/189,841

(22) Filed: Jul. 25, 2011

(65) Prior Publication Data

US 2012/0021582 A1    Jan. 26, 2012

(30) Foreign Application Priority Data

Jul. 26, 2010    (JP) .................................. 2010-167386

(51) Int. Cl.
*H01L 21/00* (2006.01)

(52) U.S. Cl.
USPC ........... 438/627; 438/393; 438/669; 438/720; 438/779; 257/E21.495; 257/E21.647; 257/E23.141

(58) Field of Classification Search .................. 438/393, 438/627, 637, 669, 712, 720, 779; 257/E21.013, 257/495, 647, 23.141
See application file for complete search history.

(56) References Cited

U.S. PATENT DOCUMENTS

| 4,444,618 | A  | * | 4/1984  | Saia et al. ...................... 438/669 |
| 6,518,179 | B1 | * | 2/2003  | Joo ............................... 438/665 |
| 2006/0177630 | A1 | * | 8/2006  | Lee et al. ...................... 428/123 |
| 2007/0134913 | A1 | * | 6/2007  | Zheng et al. .................. 438/627 |
| 2007/0228415 | A1 | * | 10/2007 | Kanamura et al. ............ 257/192 |
| 2007/0235345 | A1 | * | 10/2007 | Du et al. ........................ 205/663 |
| 2009/0065944 | A1 | * | 3/2009  | Shih ............................. 257/773 |
| 2012/0028475 | A1 | * | 2/2012  | Nishi ............................ 438/779 |

FOREIGN PATENT DOCUMENTS

JP    2006-173386 A    6/2006

* cited by examiner

*Primary Examiner* — Michael Lebentritt
(74) *Attorney, Agent, or Firm* — Westerman, Hattori, Daniels & Adrian, LLP

(57) ABSTRACT

A method of manufacturing a semiconductor device includes: forming a lower electrode layer in contact with a surface of a nitride semiconductor layer; forming an Al layer on the lower electrode layer; performing a heat treatment after the formation of the Al layer; removing the Al layer after the heat treatment is performed; and forming an upper electrode layer on the lower electrode layer after the removal of the Al layer.

12 Claims, 9 Drawing Sheets

METHOD OF MANUFACTURING SEMICONDUCTOR DEVICE

CROSS-REFERENCE TO RELATED APPLICATION

This application is based upon and claims the benefit of priority of the prior Japanese Patent Application No. 2010-167386 filed on Jul. 26, 2010, the entire contents of which are incorporated herein by reference.

BACKGROUND (i) Technical Field

A certain aspect of the embodiments discussed herein is related to a method of manufacturing a semiconductor device. Another aspect of the embodiments is related to a method of manufacturing a semiconductor device including a nitride semiconductor layer.

(ii) Related Art

In some semiconductor devices such as FETs (Field Effect Transistors), ohmic electrodes are formed on a nitride semiconductor layer, and therefore, formation of excellent ohmic contacts is required. For example, Japanese Patent Application Publication No. 2006-173386 discloses an invention in which a barrier metal is formed between each ohmic electrode and an interconnect electrode.

According to the conventional technique, hillocks appear due to stress and thermal stress. Therefore, the reliability becomes poorer, and the parasitic capacitances between the electrodes become larger. As a result, the characteristics of the semiconductor device are degraded in some cases.

SUMMARY

According to an aspect of the present invention, there is provided a method of manufacturing a semiconductor device, comprising: forming a lower electrode layer in contact with a surface of a nitride semiconductor layer; forming an Al layer on the lower electrode layer; performing a heat treatment after the formation of the Al layer; removing the Al layer after the heat treatment is performed; and forming an upper electrode layer on the lower electrode layer after the removal of the Al layer.

DETAILED DESCRIPTION

Figure 1:
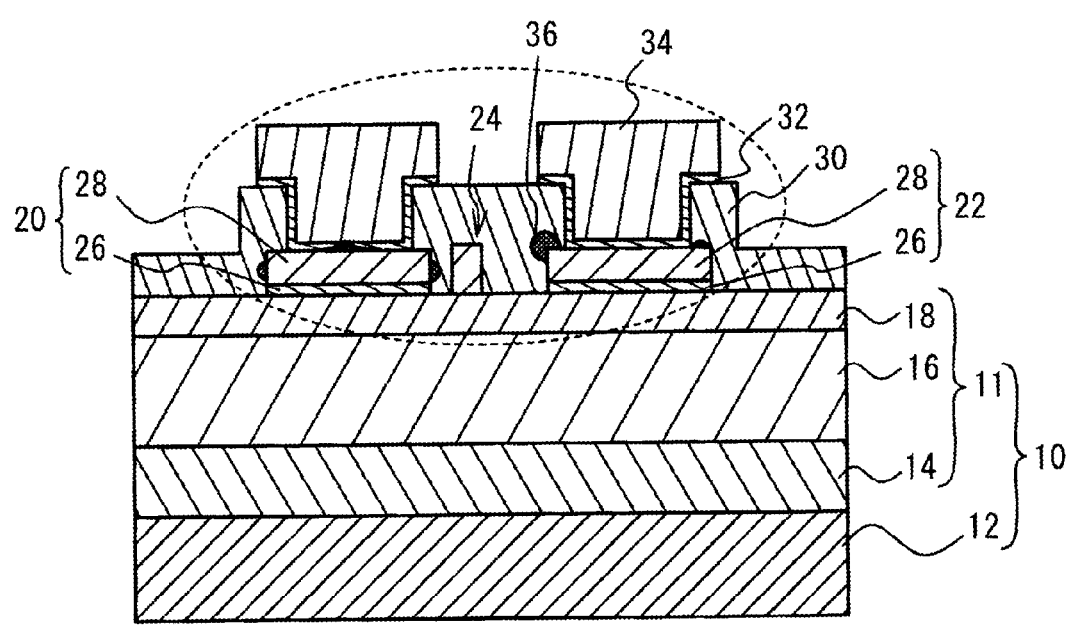
FIG. 1 is a cross-sectional view of an exemplary semiconductor device manufactured by a method of manufacturing a semiconductor device according to a comparative example.

Before embodiments of the present invention are described, a comparative example is described to make clear the problems thereof. FIG. 1 is a cross-sectional view of an exemplary semiconductor device manufactured by a method of manufacturing a semiconductor device according to the comparative example.

As shown in FIG. 1, the semiconductor device includes a semiconductor substrate 10, a source electrode 20, a drain electrode 22, a gate electrode 24, an insulating layer 30, a barrier metal 32, and interconnects 34. The semiconductor substrate 10 includes a substrate 12 and a semiconductor layer 11. The semiconductor layer 11 is formed by stacking an AlN layer 14, a GaN layer 16, and an n-AlGaN layer 18 in this order from the bottom. The GaN layer 16 functions as a channel layer, and the n-AlGaN layer 18 functions as an electron supply layer. The source electrode 20, the drain electrode 22, and the gate electrode 24 are formed on the n-AlGaN layer 18 in a contacting manner. The insulating layer 30 is formed on the n-AlGaN layer 18, the source electrode 20, the drain electrode 22, and the gate electrode 24. The barrier metal 32 is formed on the faces of the source electrode 20 and the drain electrode 22 exposed through the insulating layer 30, and on the insulating layer 30. The interconnects 34 are formed on the barrier metal 32 in a contacting manner.

The substrate 12 is made of SiC (silicon carbide) or sapphire, for example. Each of the source electrode 20 and the drain electrode 22 is an ohmic electrode that is formed by stacking a Ti layer 26 and an Al layer 28 in this order from the bottom. The gate electrode 24 is formed by stacking a Ni layer and an Au layer in this order from the bottom, for example. The insulating layer 30 is made of an insulating material such as SiN (silicon nitride). The barrier metal 32 is formed by stacking metal layers such as a TiWN (titanium tungsten nitride) layer from the bottom. The interconnects 34 are made of a metal such as Au.

The thickness of the AlN layer 14 is 300 nm, for example. The thickness of the GaN layer 16 is 1000 nm, for example. The thickness of the n-AlGaN layer 18 is 20 nm, for example. The thickness of the Ti layer 26 is 10 nm, for example. The thickness of the Al layer 28 is 300 nm, for example. The height of the gate electrode 24 is 300 nm, for example. That is, the source electrode 20 and the drain electrode 22 each have almost the same height as that of the gate electrode 24.

As indicated by curved lines and grids of lines in FIG. 1, hillocks 36 might appear on the respective Al layers 28 of the source electrode 20 and the drain electrode 22. If there is a hillock 36, the stress applied to the insulating layer 30 and the barrier metal 32 formed on the source electrode 20 and the drain electrode 22 becomes larger. As a result, the characteristics of the semiconductor device might change, or a breakdown might occur in the semiconductor device. If there are protruding hillocks 36, the distances between the electrodes becomes shorter. In such a case, the parasitic capacitance between the gate and the source, and the parasitic capacitance between the gate and the drain become larger, and the characteristics of the semiconductor device might be degraded. In some cases, the electrodes are short-circuited, and the reliability of the semiconductor device becomes poorer. Furthermore, it becomes difficult to make the semiconductor device smaller in size by reducing the distances between the electrodes. Next, a method of manufacturing the semiconductor device according to the comparative example is described to make clear the cause of the appearance of the hillocks 36.

Figure 2A:
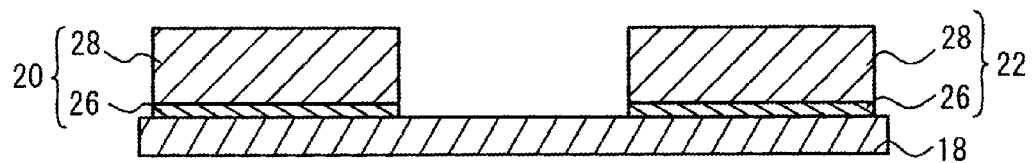
FIGS. 2A through 2C are cross-sectional views illustrating an exemplary method of manufacturing the semiconductor device according to the comparative example.
Figure 2B:
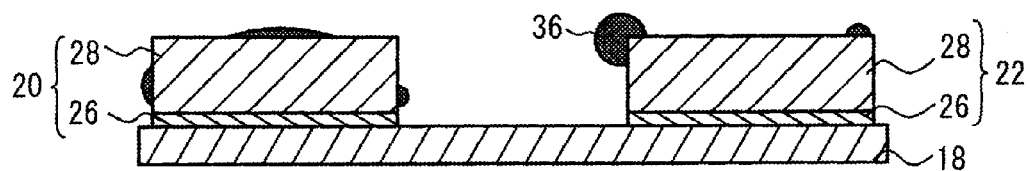
Figure 2C:
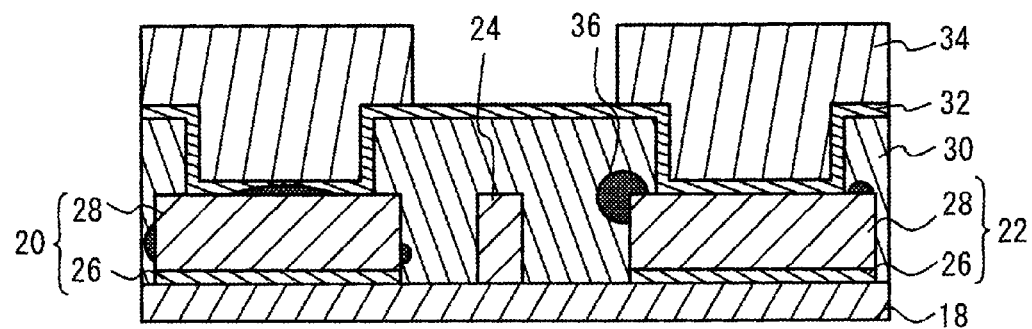

FIGS. 2A through 2C are cross-sectional views illustrating an exemplary method of manufacturing the semiconductor device according to the comparative example. In FIGS. 2A through 2C, the region shown within the dashed ellipsoidal line in FIG. 1 is enlarged, and only the n-AlGaN layer 18 of the semiconductor substrate 10 is shown.

As shown in FIG. 2A, the source electrode 20 and the drain electrode 22 are formed in a predetermined region on the n-AlGaN layer 18 by a vapor deposition technique and a liftoff technique, for example. The Ti layer 26 of each of the source electrode 20 and the drain electrode 22 is in contact with the n-AlGaN layer 18. At this point, a heat treatment process is performed to obtain preferred ohmic contacts between the n-AlGaN layer 18 and the source and drain electrodes 20 and 22. By performing the heat treatment process, a low-resistance layer is formed, and the source resistance and the drain resistance become lower. The heat treatment process is performed at a temperature of 550° C. or lower.

As shown in FIG. 2B, due to the heat treatment process, the hillocks 36 might appear on the respective Al layers 28 of the source electrode 20 and the drain electrode 22. As shown in FIG. 2C, the gate electrode 24, the insulating layer 30, the barrier metal 32, and the interconnects 34 are formed, to complete the semiconductor device shown in FIG. 1. As shown in FIGS. 2A through 2C, by the method of manufacturing the semiconductor device according to the comparative example, the hillocks 36 are formed.

Next, embodiments of the present invention are described, with reference to the accompanying drawings.

First Embodiment

FIGS. 3A through 3D are cross-sectional views showing an exemplary method of manufacturing a semiconductor device according to a first embodiment. The procedures shown in FIGS. 2A and 2B are also carried out in the first embodiment, and therefore, explanation of them will not be repeated.

Figure 3A:
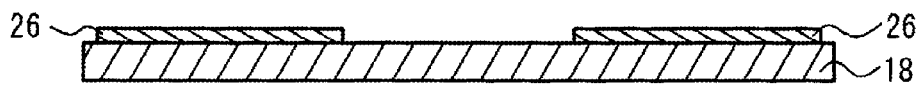
FIGS. 3A through 3D are cross-sectional views illustrating an exemplary method of manufacturing a semiconductor device according to a first embodiment.

As shown in FIG. 3A, after the heat treatment process, etching using hydrochloric acid as an etchant, for example, is performed to remove the Al layers 28. In this manner, the Al layers 28 having the hillocks 36 are removed. The Ti layers 26 (base or lower electrode layers) remain.

Figure 3B:
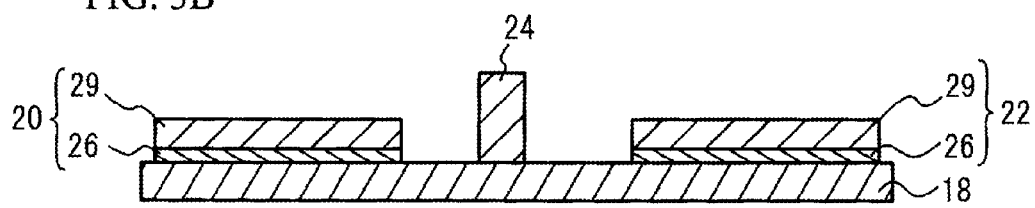

As shown in FIG. 3B, after the Al layers 28 having the hillocks 36 are removed, Au layers 29 (upper electrode layers) are formed on the Ti layers 26 by a vapor deposition technique and a liftoff technique, for example. In other words, the Au layers 29 are formed in the same regions on the n-AlGaN layer 18 as those in which the Ti layers 26 are formed. In this manner, the source electrode 20 and the drain electrode 22 are formed. By a vapor deposition technique and a liftoff technique, the gate electrode 24 is formed on a portion of the n-AlGaN layer 18 located between the source electrode 20 and the drain electrode 22. The Au layers 29 are in contact with the Ti layers 26. The thickness of each of the Au layers 29 may be 30 nm, which is smaller than the thickness of each of the Al layers 28. That is, the source electrode 20 and the drain electrode 22 each have a smaller height than that of the gate electrode 24. The length L1 of each of the source electrode 20 and the drain electrode 22 is 10 µm, for example.

Figure 3C:
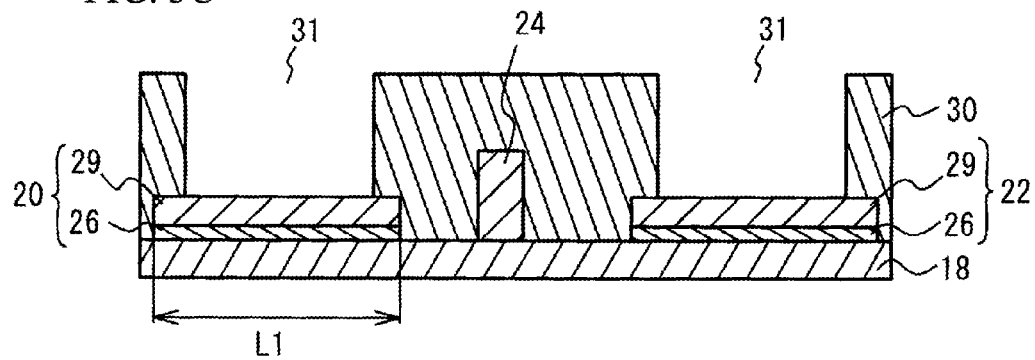

As shown in FIG. 3C, the insulating layer 30 is formed on the n-AlGaN layer 18. Openings 31 to expose the source electrode 20 and the drain electrode 22 are then formed in the insulating layer 30.

Figure 3D:
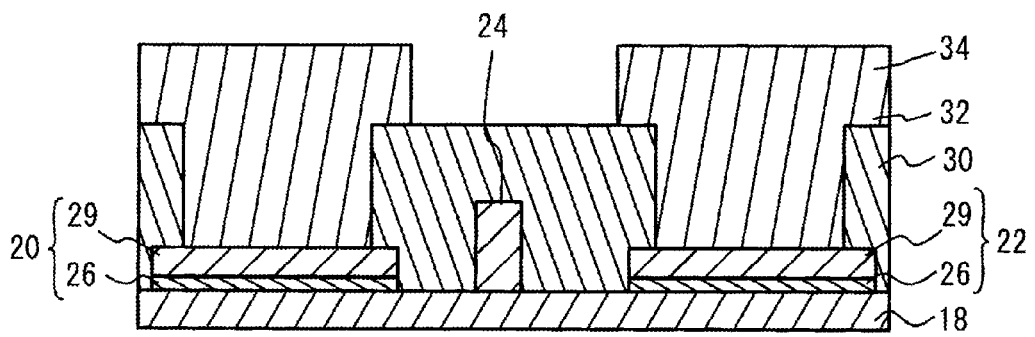

As shown in FIG. 3D, the interconnects 34 made of Au, for example, are formed in contact with the source electrode 20 and the drain electrode 22 exposed through the openings 31, by a plating technique, for example. The manufacturing process then comes to an end.

According to the first embodiment, after the heat treatment process is performed, the Al layers 28 are removed, and the Au layers 29 are formed on the Ti layers 26, to form the source electrode 20 and the drain electrode 22. Accordingly, excellent ohmic contacts can be achieved, and the hillocks 36 are removed. As a result, the stress applied to the insulating layer 30 and the barrier metal 32 can be reduced. Also, since the distance between the gate and the source, and the distance between the gate and the drain can be made longer, the parasitic capacitances between the electrodes can be made smaller. As a result, the characteristics of the semiconductor device are improved. Also, since the distances between the electrodes are made longer, short-circuiting between the electrodes are restrained, and the reliability of the semiconductor device is improved. Further, the distances between the electrodes can be made shorter to reduce the size of the semiconductor device.

The source electrode 20 and the drain electrode 22 according to the first embodiment each have a smaller height than that of the gate electrode 24. Therefore, the distance between the gate and the source, and the distance between the gate and the drain can be made longer, to reduce the parasitic capacitances.

The Au layers 29 of the source electrode 20 and the drain electrode 22, and the interconnects 34 are both made of Au, and therefore, the barrier metal 32 does not need to be formed. As the barrier metal 32 is not formed, a lower stress and lower costs can be realized. The base electrode layers of the source electrode 20 and the drain electrode 22 may be made of a metal such as Ta or Va, instead of Ti. By using Ti, Ta, Va, or the like, N (nitrogen) is drawn out of the n-AlGaN layer 18. As N is drawn out, the bandgap of the n-AlGaN layer 18 becomes lower, and an excellent ohmic contact is achieved. The upper electrode layers may be made of a metal such as Pt, instead of Au. Alternatively, the upper electrode layers may be made of Al, so that the heat treatment process that causes hillocks does not need to be performed after the upper electrode layers are formed. In a case where a metal other than Au is used for the upper electrode layers, it is preferable to form the barrier metal 32, so as to improve the adhesion to the interconnects 34. In a case where the upper electrode layers include the Au layers 29, and the Au layers 29 are stacked as the uppermost layers, the barrier metal 32 does not need to be formed as shown in FIG. 3D.

The distance between the source electrode 20 and the gate electrode 24 is shorter than the distance between the drain electrode 22 and the gate electrode 24. With this arrangement, the withstand voltage between the gate and drain can be made higher. The etchant may not be hydrochloric acid, but may be a solution of sulfuric acid and hydrogen peroxide, or phosphoric acid, or the like.

As the semiconductor layer 11, nitride semiconductors other than GaN and AlGaN may be used. A nitride semiconductor is a semiconductor containing nitrogen. Other than GaN and AlGaN, nitride semiconductors are InN (indium nitride), AlN (aluminum nitride), InGaN (indium gallium nitride), InAlN (indium aluminum nitride), AlInGaN (aluminum indium gallium nitride), and the like. As the semiconductor layer 11, semiconductors containing As may also be used. Examples of such semiconductors include GaAs (gallium arsenide), AlAs (aluminum arsenide), InAs (indium arsenide), InGaAs (indium gallium arsenide), AlGaAs (aluminum gallium arsenide), and AlInGaAs (aluminum indium gallium arsenide).

Second Embodiment

Figure 4A:
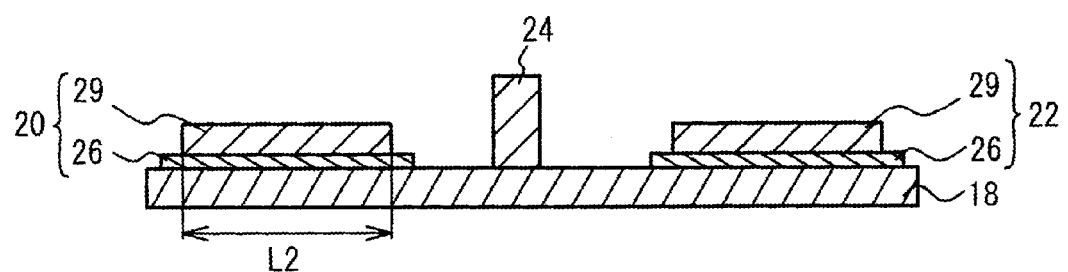
FIGS. 4A and 4B are cross-sectional views illustrating an exemplary method of manufacturing a semiconductor device according to a second embodiment.
Figure 4B:
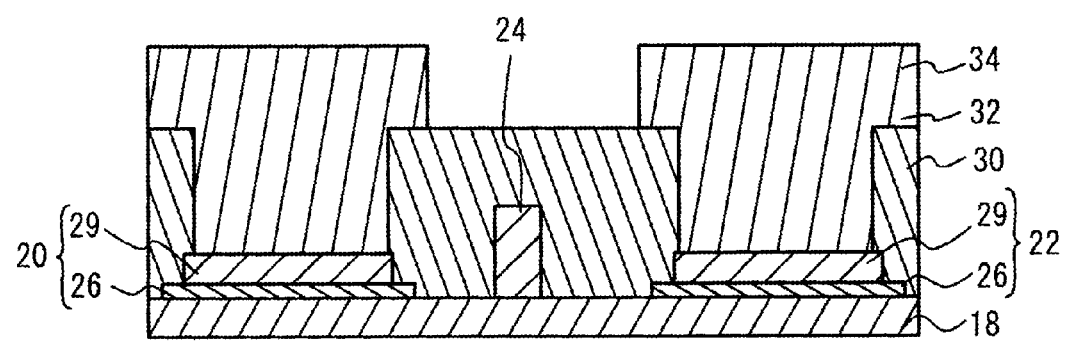

A second embodiment concerns an example in which the upper electrode layers are made smaller. FIGS. 4A and 4B are cross-sectional views showing an exemplary method of manufacturing a semiconductor device according to the second embodiment. Explanation of the same aspects as those of the already described embodiment will not be repeated.

As shown in FIG. 4A, after the Al layers 28 are removed, the Au layers 29 are formed on the Ti layers 26. The gate electrode 24 is formed on the n-AlGaN layer 18. The length L2 of each of the Au layers 29 is smaller than the length L1 of each of the Ti layers 26 shown in FIG. 3C. In other words, the Au layers 29 in the second embodiment are further away from the gate electrode 24 than those in the first embodiment. That is, in the procedure for forming the Au layers 29, the Au layers 29 are formed so that ends of the Au layers 29 are further away from the gate electrode 24 than ends of the Ti layers 26 located under the Au layers 29.

As shown in FIG. 4B, the interconnects 34 made of Au, for example, are formed in contact with the source electrode 20 and the drain electrode 22 by a plating technique, for example. The manufacturing process then comes to an end.

According to the second embodiment, the characteristics of the semiconductor device can be improved, and short-circuiting between the electrodes can be restrained as in the first embodiment. Also, since the length of the Au layers 29 is made smaller, the distances between the gate electrode 24 and the source and drain electrodes 20 and 22 become longer, and the parasitic capacitances between the electrodes become smaller, accordingly. Thus, the characteristics of the semiconductor device can be improved, and short-circuiting between the electrodes can also be restrained.

Third Embodiment

Figure 5A:
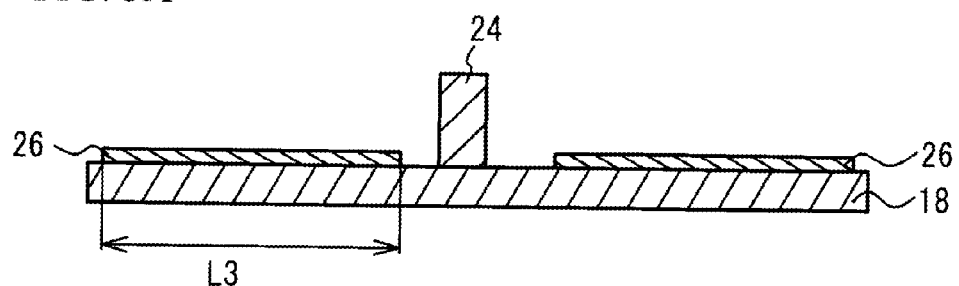
FIGS. 5A and 5B are cross-sectional views illustrating an exemplary method of manufacturing a semiconductor device according to a third embodiment.
Figure 5B:
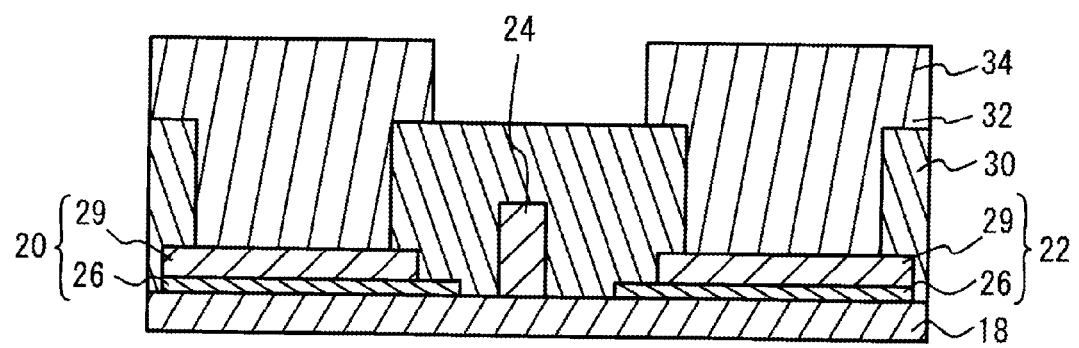

A third embodiment concerns an example in which the base electrode layers are made larger. FIGS. 5A and 5B are cross-sectional views showing an exemplary method of manufacturing a semiconductor device according to the third embodiment. Explanation of the same aspects as those of the already described embodiments will not be repeated.

As shown in FIG. 5A, after the Al layers 28 are removed, the Au layers 29 are formed on the Ti layers 26. The gate electrode 24 is formed on the n-AlGaN layer 18. The length L3 of each of the Ti layers 26 is greater than the length L1 of each of the Au layers 29. In other words, the Ti layers 26 in the third embodiment extend closer to the gate electrode 24 than those in the first embodiment. That is, in the procedure for forming the Au layers 29, the Au layers 29 are formed so that ends of the Au layers 29 are further away from the gate electrode 24 than ends of the Ti layers 26. The length L3 may be 6 μm, which is smaller than the length L1 of the source electrode 20 in the first embodiment.

As shown in FIG. 5B, the interconnects 34 made of Au, for example, are formed in contact with the source electrode 20 and the drain electrode 22 by a plating technique, for example. The manufacturing process then comes to an end.

According to the third embodiment, the characteristics of the semiconductor device can be improved, and short-circuiting between the electrodes can be restrained as in the first embodiment. Also, since the length of the Ti layers 26 is made greater, the source resistance and the drain resistance become lower. Thus, the characteristics of the semiconductor device are improved.

Fourth Embodiment

A fourth embodiment concerns an example in which a protection film is used. FIGS. 6A through 7B are cross-sectional views showing an exemplary method of manufacturing a semiconductor device according to the fourth embodiment. Explanation of the same aspects as those of the already described embodiments will not be repeated.

Figure 6A:
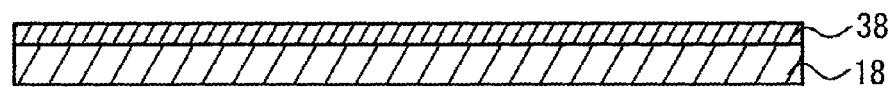
FIGS. 6A through 6D are cross-sectional views illustrating an exemplary method of manufacturing a semiconductor device according to a fourth embodiment.
Figure 6B:
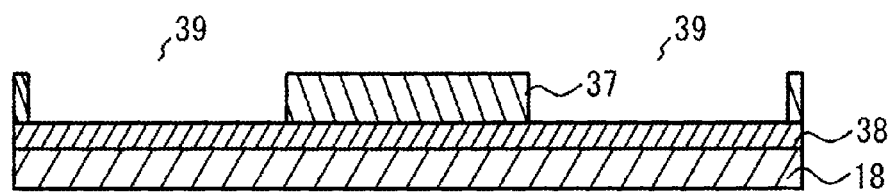

As shown in FIG. 6A, a protection film 38 made of an insulating material such as SiN is first formed on the n-AlGaN layer 18. As shown in FIG. 6B, a resist 37 is formed on the protection film 38. The resist 37 has openings 39 to expose part of the upper face of the protection film 38.

Figure 6C:
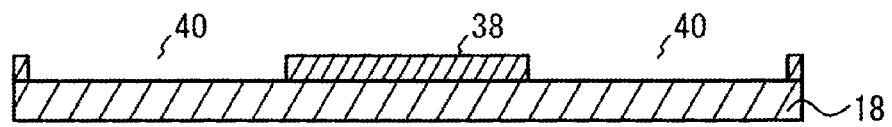
Figure 6D:
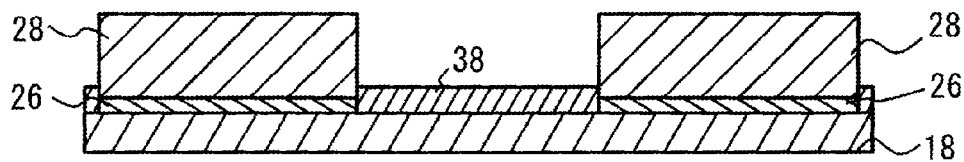

As shown in FIG. 6C, the exposed portions of the protection film 38 are removed by etching, for example. After the etching, the resist 37 is removed. Openings 40 are formed in the protection film 38. As shown in FIG. 6D, the Ti layers 26 are formed in the openings 40 of the protection film 38, and the Al layers 28 are formed on the Ti layers 26. Further, a heat treatment process is performed. Through the heat treatment process, hillocks 36 are formed on the Al layers 28.

Figure 7A:
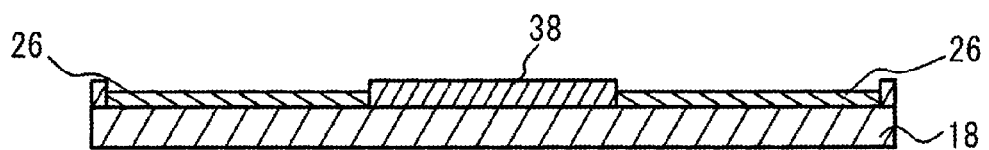
FIGS. 7A and 7B are cross-sectional views illustrating an exemplary method of manufacturing a semiconductor device according to a fourth embodiment.
Figure 7B:
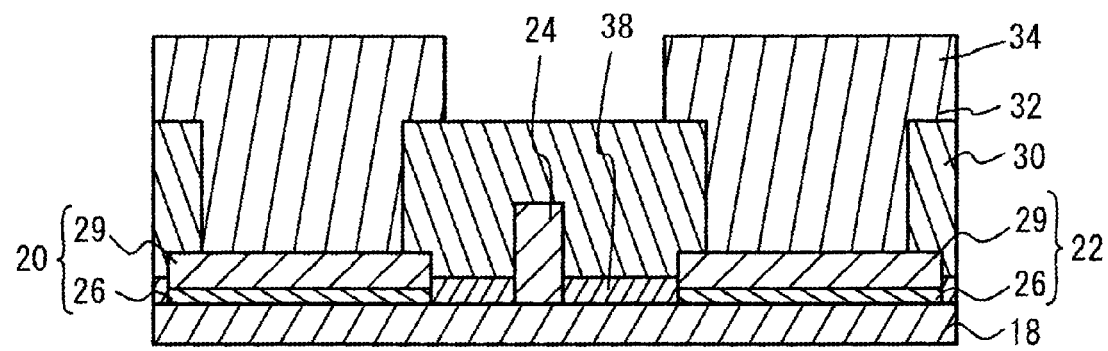

As shown in FIG. 7A, after the heat treatment process, the Al layers 28 are removed by etching, for example. At this point, the n-AlGaN layer 18 is protected from the etchant by the protection film 38. As shown in FIG. 7B, the Au layers 29, the insulating layer 30, and the interconnects 34 are formed. The semiconductor device manufacturing process then comes to an end.

According to the fourth embodiment, the characteristics of the semiconductor device can be improved, and short-circuiting between the electrodes can be restrained as in the first embodiment. Since the protection film 38 is provided, the n-AlGaN layer 18 is not damaged by etching. Accordingly, the contact between the gate electrode 24 and the n-AlGaN layer 18 is stabilized. Thus, current leakage between the gate and the source can be restrained, and the pinch-off voltage can be stabilized, for example.

Fifth Embodiment

A fifth embodiment concerns an example in which a cap layer and recesses are formed. FIGS. 8A through 8D are cross-sectional views showing an exemplary method of manufacturing a semiconductor device according to the fifth embodiment. Explanation of the same aspects as those of the already described embodiments will not be repeated.

Figure 8A:
FIGS. 8A through 8D are cross-sectional views illustrating an exemplary method of manufacturing a semiconductor device according to a fifth embodiment.

As shown in FIG. 8A, an n-GaN layer 19 is formed on the n-AlGaN layer 18. That is, the semiconductor layer 11 is formed by stacking the substrate 12, the AlN layer 14, the GaN layer 16, the n-AlGaN layer 18, and the n-GaN layer 19 in this order from the bottom (also see FIG. 1). The n-GaN layer 19 has a thickness of 5 nm, for example, and functions as a cap layer.

Figure 8B:
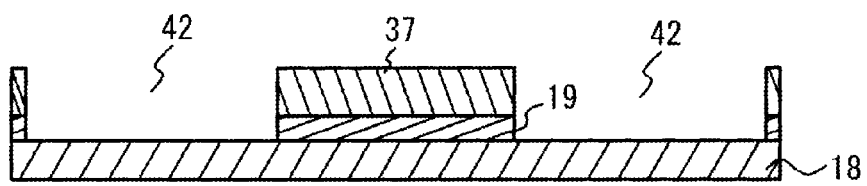
Figure 8C:
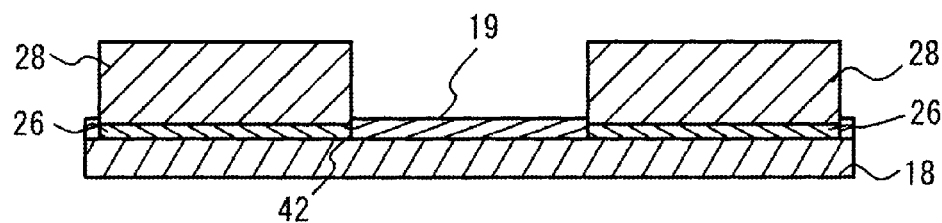

As shown in FIG. 8B, a resist 37 is formed on the n-GaN layer 19, and part of the n-GaN layer 19 is removed by etching, for example. In this manner, recesses 42 are formed. As shown in FIG. 8C, the Ti layers 26 are formed in the recesses 42, and the Al layers 28 are formed on the Ti layer 26.

Figure 8D:
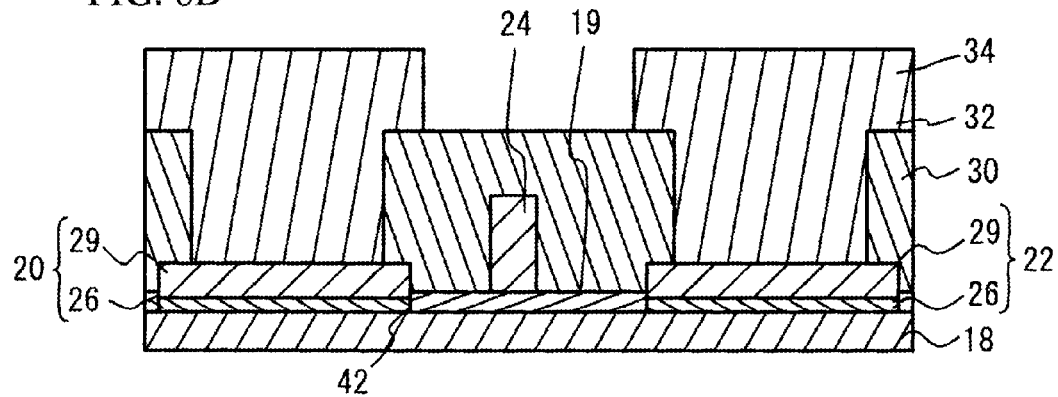

Thereafter, the same procedures as those shown in FIGS. 3A through 3D are carried out, to complete the semiconductor device as shown in FIG. 8D.

According to the fifth embodiment, the characteristics of the semiconductor device can be improved, and short-circuiting between the electrodes can be restrained as in the first embodiment. Also, as the source electrode 20 and the drain electrode 22 are formed in the recesses 42, the source resistance and the drain resistance become lower, and the resistances between the electrodes also become lower. As a result, the characteristics of the semiconductor device are further improved.

Sixth Embodiment

A sixth embodiment concerns an example in which a protection film is used. FIGS. 9A through 9D are cross-sectional views showing an exemplary method of manufacturing a semiconductor device according to the sixth embodiment. Explanation of the same aspects as those of the already described embodiments will not be repeated.

Figure 9A:
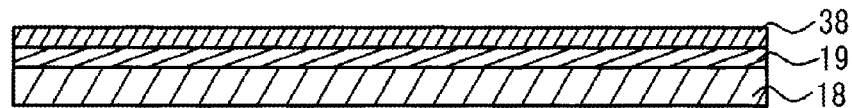
FIGS. 9A through 9D are cross-sectional views illustrating an exemplary method of manufacturing a semiconductor device according to a sixth embodiment.
Figure 9B:
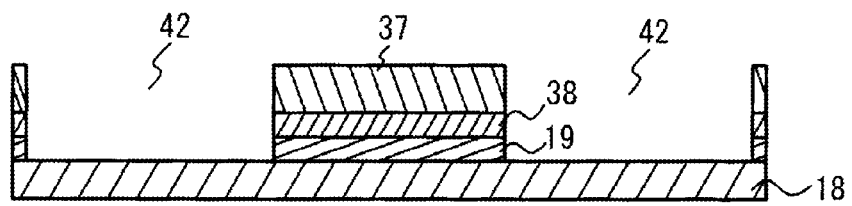
Figure 9C:
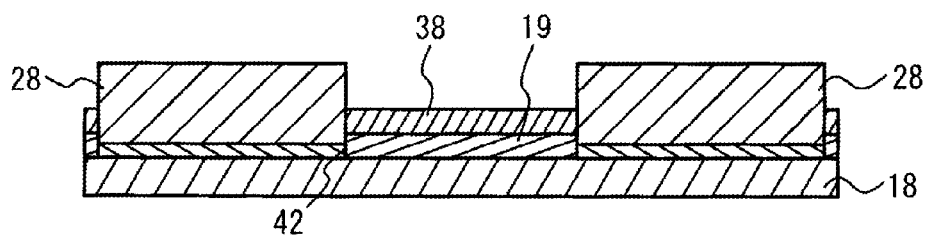
Figure 9D:
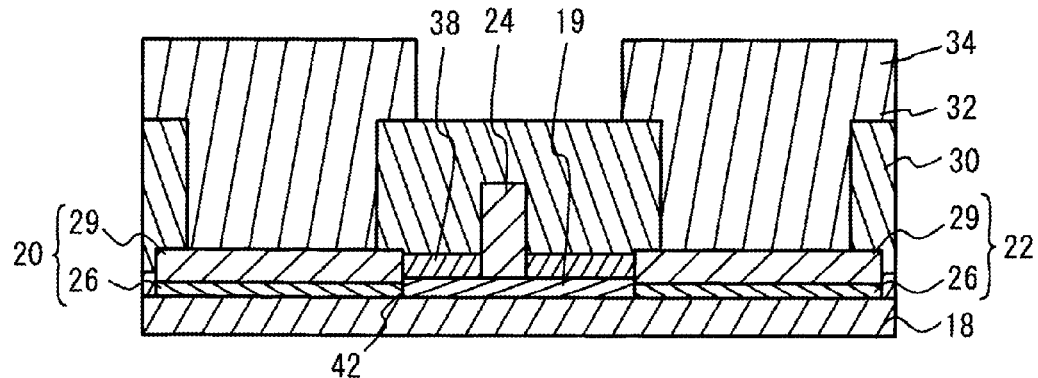

As shown in FIG. 9A, an n-GaN layer 19 is formed on the n-AlGaN layer 18, and a protection film 38 is formed on the n-GaN layer 19. As shown in FIG. 9B, a resist 37 is formed on the protection film 38, and part of the protection film 38 and part of the n-GaN layer 19 are removed by etching, for example. In this manner, recesses 42 are formed. As shown in FIG. 9C, the Ti layers 26 are formed in the recesses 42, and the Al layers 28 are formed on the Ti layer 26. Thereafter, the same procedures as those shown in FIGS. 3A through 3D are carried out, to complete the semiconductor device as shown in FIG. 9D.

According to the sixth embodiment, the characteristics of the semiconductor device can be improved, and short-circuiting between the electrodes can be restrained as in the first embodiment. Also, as the protection film 38 is provided, the n-AlGaN layer 18 is not damaged by etching. Thus, current leakage between the gate and the source can be restrained, and the pinch-off voltage can be stabilized, for example. Further, as the recesses 42 are formed, the source resistance and the drain resistance become lower, and the characteristics of the semiconductor device are further improved.

What is claimed is:

1. A method of manufacturing a semiconductor device, comprising:
    forming a lower electrode layer in contact with a surface of a nitride semiconductor layer;
    forming an Al layer on the lower electrode layer;
    performing a heat treatment after the formation of the Al layer;
    removing the Al layer after the heat treatment is performed; and
    forming an upper electrode layer on the lower electrode layer after the removal of the Al layer.

2. The method according to claim 1 wherein the lower electrode layer is formed on a recess located in the nitride semiconductor layer.

3. The method according to claim 1, wherein the lower electrode layer is made of at least one of Ti, Ta, and Va.

4. The method according to claim 1, wherein the upper electrode layer includes Au.

5. The method according to claim 1, wherein a laminated structure of the upper electrode layer and the lower electrode layer are a source electrode and a drain electrode.

6. The method according to claim 5, wherein a gate electrode is formed between the source and drain electrodes, and an edge of the gate electrode side of the upper electrode layer is located inside of an edge of the lower electrode layer.

7. The method according to claim 1, wherein
    the removing the Al layer includes removing the Al layer by etching, and
    the method further comprising
    forming a protection film to protect the nitride semiconductor layer from the etching, the protection film being formed on the nitride semiconductor layer prior to the removal of the Al layer.

8. The method according to claim 1, further comprising:
    forming a barrier metal on the upper electrode layer; and
    forming an interconnect on the barrier metal.

9. The method according to claim 1, wherein the nitride semiconductor is at least one of GaN, AlGaN, InN, AlN, InGaN, InAlN, and AlInGaN.

10. The method according to claim 4, further comprising forming an interconnect directory on the upper electrode layer.

11. The method according to claim 7, wherein an etchant of the etching is one of a hydrochloric acid, a solution of sulfuric acid and hydrogen peroxide, and a phosphoric acid.

12. The method according to claim 7, wherein the protection film is SiN.

* * * * *